United States Patent
Kawakita

(10) Patent No.: US 8,653,666 B2
(45) Date of Patent: Feb. 18, 2014

(54) SEMICONDUCTOR STORAGE DEVICE HAVING A PERIPHERAL CIRCUIT REGION AND A MEMORY CELL REGION

(76) Inventor: Keizo Kawakita, Tokyo (JP)

(*) Notice: Subject to any disclaimer, the term of this patent is extended or adjusted under 35 U.S.C. 154(b) by 333 days.

(21) Appl. No.: 12/882,454

(22) Filed: Sep. 15, 2010

(65) Prior Publication Data

US 2011/0221034 A1 Sep. 15, 2011

(30) Foreign Application Priority Data

Sep. 16, 2009 (JP) ................... 2009-214457

(51) Int. Cl.
*H01L 23/52* (2006.01)
(52) U.S. Cl.
USPC .... 257/758; 257/532; 257/638; 257/E23.142; 257/E23.144
(58) Field of Classification Search
USPC ................. 257/522, 532, 638, 758, E23.141, 257/E23.142, E23.144
See application file for complete search history.

(56) References Cited

U.S. PATENT DOCUMENTS

| | | | | |
|---|---|---|---|---|
| 6,479,366 B2 * | 11/2002 | Miyamoto | ................ | 438/422 |
| 6,509,593 B2 * | 1/2003 | Inoue et al. | ................ | 257/295 |
| 6,911,686 B1 * | 6/2005 | Itoh | ................ | 257/296 |
| 8,247,902 B2 * | 8/2012 | Noguchi et al. | ............... | 257/758 |
| 2001/0006834 A1 * | 7/2001 | Hirota et al. | ................ | 438/244 |
| 2009/0142919 A1 * | 6/2009 | Noguchi et al. | ............... | 438/633 |
| 2009/0263951 A1 * | 10/2009 | Shibata et al. | ............... | 438/422 |
| 2010/0019348 A1 * | 1/2010 | Nagai | ............... | 257/532 |

FOREIGN PATENT DOCUMENTS

| | | |
|---|---|---|
| JP | 2001-156267 | 6/2001 |
| JP | 2002-343862 | 11/2002 |

* cited by examiner

*Primary Examiner* — Matthew E Warren
(74) *Attorney, Agent, or Firm* — Young & Thompson

(57) ABSTRACT

A semiconductor storage device comprises a peripheral circuit region including a wiring layer having wiring patterns, a cavity formed in a non-wiring region between the wiring patterns of the wiring layer, and an insulating film forming at least a part of a wall defining the cavity, and a memory cell region.

20 Claims, 23 Drawing Sheets

SEMICONDUCTOR STORAGE DEVICE HAVING A PERIPHERAL CIRCUIT REGION AND A MEMORY CELL REGION

BACKGROUND OF THE INVENTION

1. Field of the Invention

The present invention relates to a semiconductor storage device, and more particularly to a semiconductor storage device having a peripheral circuit region and a memory cell region.

2. Description of the Related Art

A semiconductor storage device represented by a DRAM (Dynamic Random Access Memory) includes, in general, a memory cell region in which information is stored and a peripheral circuit region that controls writing information to the memory cell region and reading it therefrom.

In recent years, in such a semiconductor storage device, there is a growing demand for an increase in storage capacity. For this purpose, the semiconductor storage device is reduced in size and microminiaturized. However, the reduction in size and the microminiaturization reduces the distance between wiring lines, leading to an increase in parasitic capacitance between wiring lines and therefore to signal delay.

To solve the problem of the signal delay, for example, JP 2001-156267 and JP 2002-343862 disclose a method of forming a cavity in a space between electrodes and between wiring layers for the purpose of reducing the parasitic capacitance between wiring lines.

The aforementioned method is intended to reduce the parasitic capacitance between wiring lines, such as gate electrodes (word lines) and contact plugs, in the memory cell region. However, it gives no consideration to other wiring layers, particularly in the peripheral circuit region. In other words, no solution is presented for the problem of the signal delay due to the wiring layers in the peripheral circuit region. Therefore, also for the wiring layer in the peripheral circuit region, the requirement is to reduce the parasitic capacitance between wiring lines.

SUMMARY

In one embodiment, there is provided a semiconductor storage device that comprises a peripheral circuit region including a wiring layer having wiring patterns, a cavity formed in a non-wiring region between the wiring patterns of the wiring layer, and an insulating film forming at least a part of a wall defining the cavity, and a memory cell region.

In another embodiment, there is provided a semiconductor storage device that comprises a peripheral circuit region including, a wiring layer having wiring patterns, a cavity formed in a non-wiring region between the wiring patterns of the wiring layer, a first insulating film provided above the wiring layer, the first insulating film having an opening opened in the non-wiring region, and a second insulating film provided on the first insulating film to close the opening, the second insulating film forming at least a part of a wall defining the cavity, and a memory cell region.

In yet another embodiment, there is provided a semiconductor storage device that comprises a peripheral circuit region including, first and second wiring layers each having wiring patterns, the first wiring layer being provided above the second wiring layer, a cavity formed in one or more non-wiring regions between the wiring patterns in the first wiring layer and between the wiring patterns in the second wiring layer, and an insulating film forming at least a part of a wall defining the cavity, and a memory cell region.

In this semiconductor storage device, a cavity is formed in a non-wiring region of wiring layers of the peripheral circuit region, wherein the cavity is defined by an insulating film (a second insulating film) different from an interlayer insulating film, with which the non-wiring region has been filled during the manufacturing process. This makes it possible to reduce the parasitic capacitance between wiring lines in the peripheral circuit region.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In this specification, a DRAM will be explained as an example of a semiconductor storage device of the present invention, the DRAM including a peripheral circuit region in which layers (wiring layers) that are the same as a capacitance contact pad that connects a capacitance contact plug and a capacitor lower electrode in a memory cell region are provided.

(First Embodiment)

Figure 1:
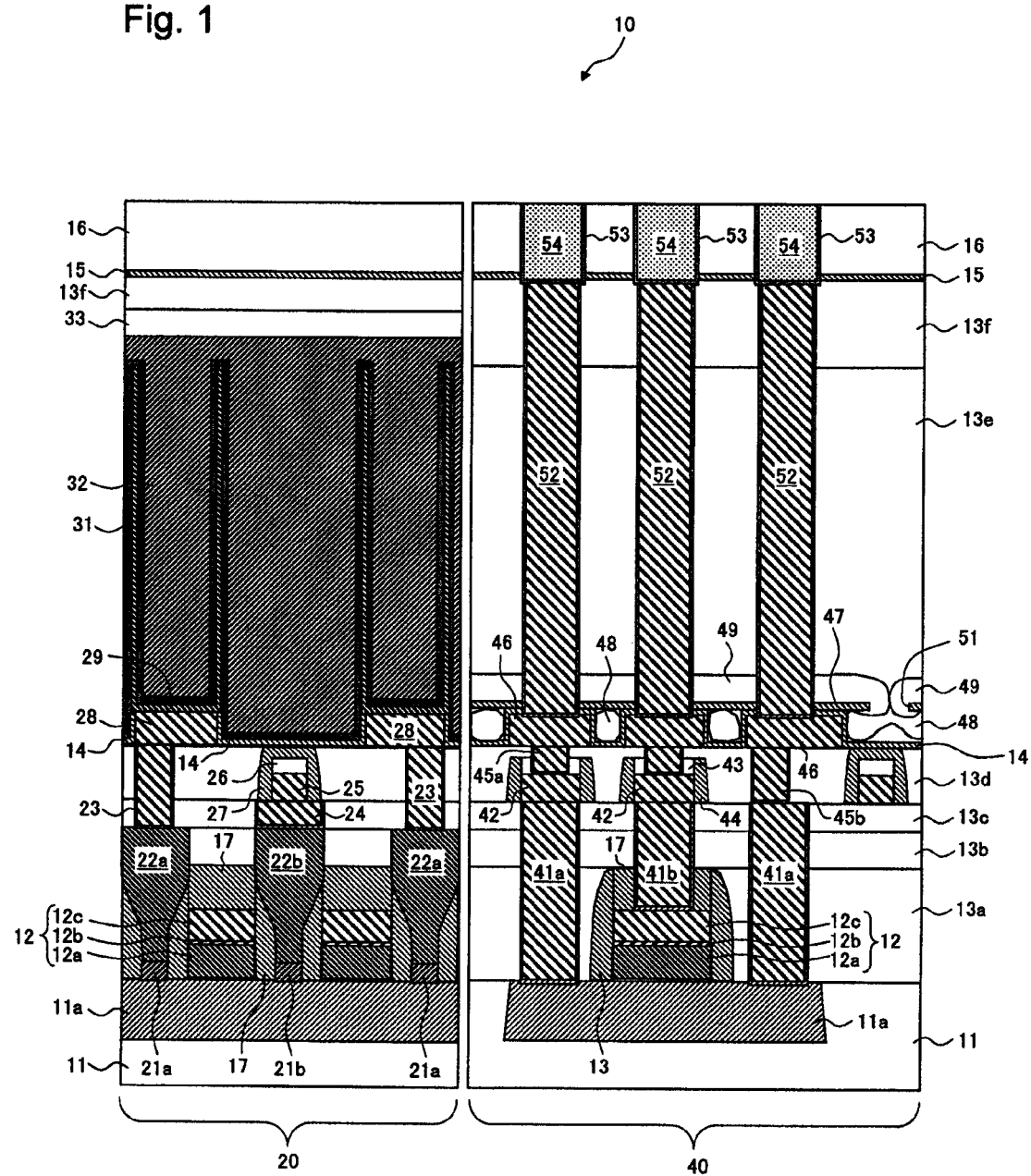
FIG. 1 is a sectional view schematically showing a DRAM as a semiconductor storage device in a first embodiment of the present invention.

FIG. 1 is a sectional view schematically showing DRAM 10 in a first embodiment, and shows a section taken along a direction perpendicular to a substrate.

DRAM 10 in this embodiment includes memory cell region 20 and peripheral circuit region 40. In this specification, unless specifically referred to, the same reference numerals and signs in the respective regions denote the same layers.

First, a layer configuration of memory cell region 20 will be explained. In memory cell region 20 shown on the left side of FIG. 1, two transistors are provided on diffusion region 11a of semiconductor substrate 11 made of silicon. Each of the transistors includes gate electrode (word line) 12 laminated via gate oxide films (not shown) and silicon epitaxial layers 21a, 21b functioning as source/drain regions. In this embodiment, gate electrode 12 has a so-called polycide structure in which polysilicon 12a and tungsten silicide 12b are sequentially laminated. On tungsten silicide 12b, Tungsten 12c is provided for reducing the resistance of gate electrode 12. The periphery of gate electrode 12 is covered with gate cap insulating layer 17 made of silicon nitride.

One of the source/drain regions (the silicon epitaxial layers) 21a is connected to capacitance contact plug 23 via contact plug 22a. The other, denoted by 21b, is connected to bit line 25 made of tungsten via contact plug 22b and contact 24. On bit line 25, hard mask 26 made of silicon nitride is formed for fabricating wiring. Sidewall 27 made of silicon nitride is formed around bit line 25 and hard mask 26. Contact plugs 22a, 22b, capacitance contact plug 23, contact 24, bit line 25, hard mask 26, and sidewall 27 are formed in interlayer insulating films 13b-13d. Interlayer insulating films denoted by 13b and 13c are made of silicon oxide. Interlayer insulating film denoted by 13d is made of Spin On Dielectrics (SOD, an applied insulating material).

Capacitance contact plug 23 is connected to capacitor lower electrode 29 of the capacitor through capacitance contact pad 28 covered with cylinder stopper film 14 made of silicon nitride.

Capacitance film 31, plate electrode support film 32 including a capacitor upper electrode, and plate electrode 33 are laminated on the surface of capacitor lower electrode 29. Capacitance film 31, plate electrode support film 32, and plate electrode 33 are buried by interlayer insulating film 13f. Cu stopper film 15 and low dielectric constant film 16 are provided on interlayer insulating film 13f.

Next, a layer configuration of peripheral circuit region 40 will be explained.

Similarly, peripheral circuit region 40 shown on the right side of FIG. 1 includes gate electrode 12 and gate cap insulating layer 17 formed therearound in interlayer insulating film 13a made of SOD, wherein gate electrode 12 has the same structure as gate electrode 12 formed in memory cell region 20.

Diffusion region 11a and gate electrode 12 of peripheral circuit region 40 are connected to second wiring layers 42, which are made of tungsten and formed in interlayer insulating film 13d, through contact plugs 41a, 41b that pierce through interlayer insulating films 13a-13c. Second wiring layers 42 of peripheral circuit region 40 are the same as bit lines of memory cell region 20.

As in memory cell region 20, hard masks 43 for fabricating wiring are formed on second wiring layers 42. Sidewalls 44 made of silicon nitride are formed around second wiring layers 42 and hard masks 43. On the other hand, second wiring layers 42 are connected to first wiring layers 46 through contact plugs 45a formed in hard masks 43 and interlayer insulating film 13d.

Wet stopper film (first insulating film) 47 made of silicon nitride is provided on first wiring layers 46 via cylinder stopper film 14 made of silicon nitride. Cavities 48 are formed in non-wiring regions between wiring patterns of first wiring layers 46, wherein non-wiring regions are surrounded by cylinder stopper film 14 and wet stopper film 47.

At least a part of walls defining cavities 48 is formed of silicon oxide film (second insulating film) 49 deposited by a plasma Chemical Vapor Deposition (CVD) using TEOS (TetraEthyl OrthoSilicate, tetraethoxysilane) as a raw material. Silicon oxide film 49 is formed such that opening 51 of wet stopper film 47, which is opened in the non-wiring region between the wiring patterns, is closed. This is a significant feature of the present invention. Specifically, when silicon oxide film 49 is formed on wet stopper film 47, silicon oxide film 49 intrudes into the non-wiring regions (where the cavities are formed) between the wiring patterns from opening 51 of wet stopper film 47. However, before the non-wiring regions are completely filled with silicon oxide film 49, silicon oxide film 49 closes opening 51 of wet stopper film 47, whereby cavities 48 are formed in the non-wiring regions. This process will be described later in detail.

First wiring layers 46 are connected to Cu barrier films 53 and Cu wires 54 via through holes 52 that pierce through wet stopper film 47, silicon oxide film 49, and interlayer insulating films 13e, 13f. Cu wirings 54 are buried in low dielectric constant film 16 for reducing inter-wire capacitance of Cu wires 54, wherein low dielectric constant film 16 is formed on interlayer insulating film 13f via Cu stopper film 15.

As explained above, cavities 48 defined by walls made of silicon oxide film 49 are formed in the non-wiring regions between the wiring patterns of first wiring layers 46. Cavities 48 allow the dielectric constant of the regions between the wiring patterns of first wiring layers 46 to be reduced, and therefore the parasitic capacitance to be reduced.

In this embodiment, first wiring layers 46 of peripheral circuit region 40 are formed as layers that are the same as a capacitance contact pad 28 that connects capacitance contact plug 23 and capacitor lower electrode 29 of memory cell region 20. This makes it possible to reduce the depth of through holes 52 formed in interlayer insulating films 13e, 13f compared with that when first wiring layers 46 are not present. Consequently, it is possible to reduce a load in an etching process by reducing an aspect ratio during etching when through hole 52 is formed.

A method of manufacturing the DRAM in this embodiment will be explained with reference to FIGS. 2 to 11. Here, a method of forming a plurality of layers above interlayer insulating film 13c, which is a characteristic feature of the present invention, will be explained in detail.

FIGS. 2 to 11 are schematic sectional views of the DRAM in respective steps of the manufacturing method thereof according to this embodiment, and show sections taken along the direction perpendicular to the substrate.

Figure 2:
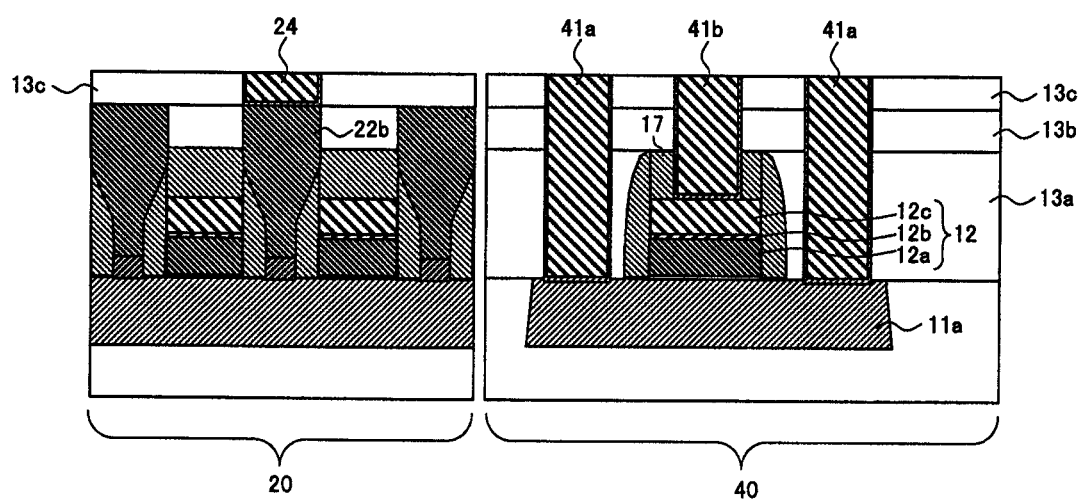
FIGS. 2 to 11 are diagrams showing steps of a method of manufacturing the DRAM in the first embodiment of the present invention.

First, as shown in FIG. 2, in memory cell region 20, layers up to contact 24 connected to contact plug 22b are formed in interlayer insulating film 13c. On the other hand, in peripheral circuit region 40, layers up to contact plugs 41a, 41b are formed, wherein contact plugs denoted by 41a are connected to diffusion region 11a piercing through interlayer insulating films 13a-13c, and contact plug denoted by 41b is connected to gate electrode 12 piercing through interlayer insulating film 13b, 13c and gate cap insulating layer 17.

Figure 3:
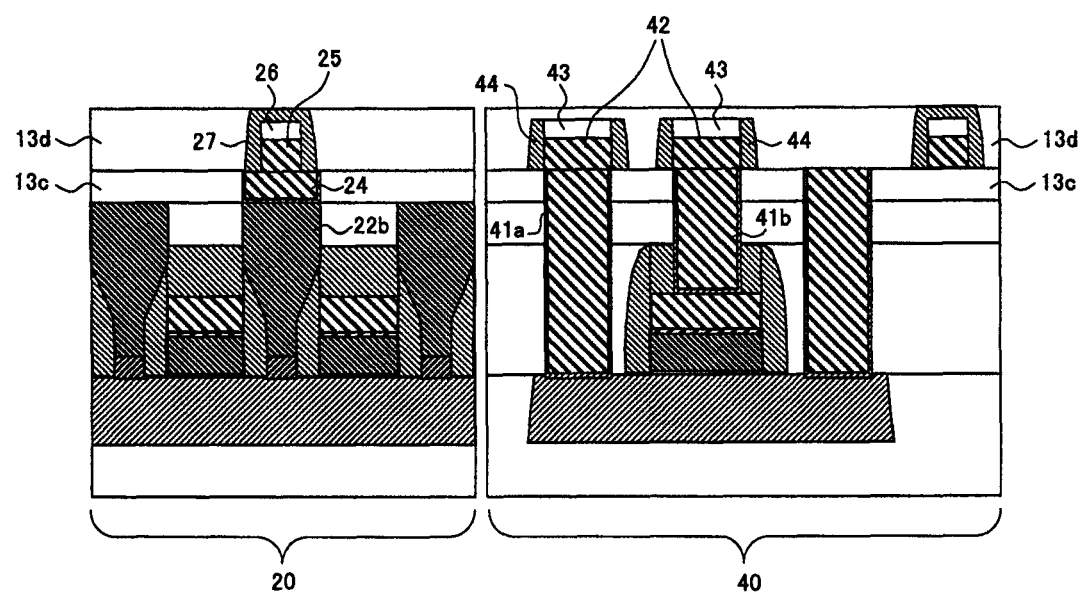

Next, as shown in FIG. 3, a tungsten film, which will become bit line 25 in memory cell region 20 and become second wiring layers 42 in peripheral circuit region 40, is deposited on interlayer insulating film 13c. A silicon nitride film that will become hard masks 26, 43 is deposited on the tungsten film. Then, patterns of bit line 25 and second wiring layers 42 are formed by lithography and dry etching. In this way, in memory cell region 20, bit line 25 connected to contact plug 22b via contact 24 is formed, and in peripheral circuit region 40, second wiring layers 42 connected to contact plugs 41a, 41b are formed. Thereafter, silicon nitride is formed as a film and etched back to form respective sidewalls 27, 44 of bit line 25 and second wiring layers 42. At this stage, the silicon nitride on hard masks 43 in peripheral circuit region 40 has been removed. This allows second wiring layers 42 to be connected to an upper wiring layer described below. Interlayer insulating film 13d made of SOD is formed so as to bury bit line 25, second wiring layers 42, sidewalls 27, 44, and hard masks 43. The surface of interlayer insulating film 13d is planarized by Chemical Mechanical Polishing (CMP).

Figure 4:
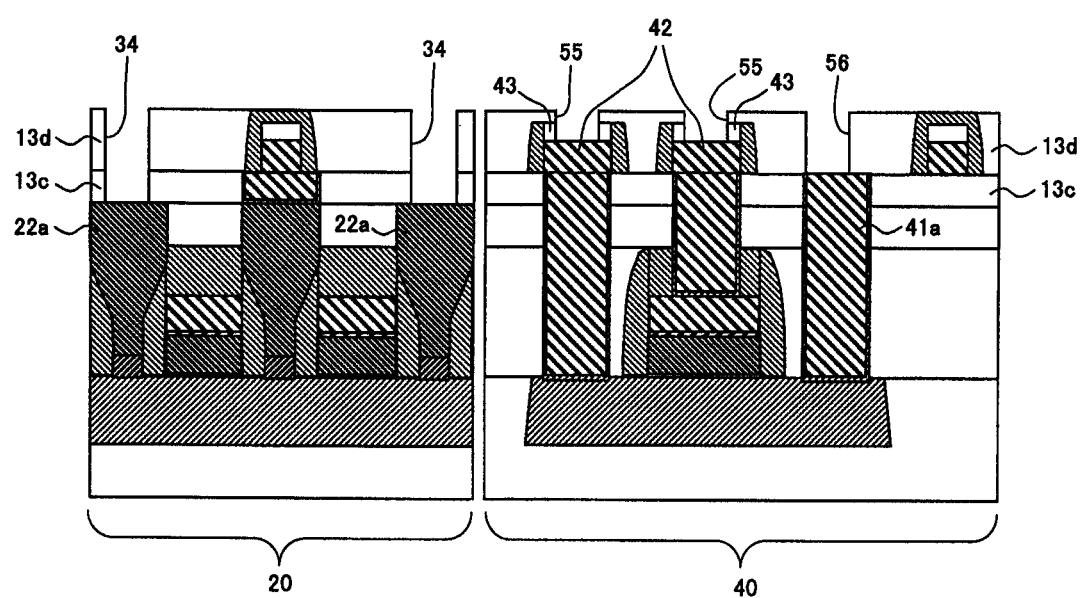

As shown in FIG. 4, holes 34, 55, 56 are respectively formed in memory cell region 20 and peripheral circuit region 40 by lithography and dry etching. In memory cell region 20, holes 34 that pierce through interlayer insulating films 13c, 13d are formed so as to expose contact plugs 22a. In peripheral circuit region 40, holes 55 that pierce through hard masks 43 are formed to expose second wiring layers 42, and hole 56 that pierces through interlayer insulating film 13d is formed to expose contact plug 41.

Figure 5:
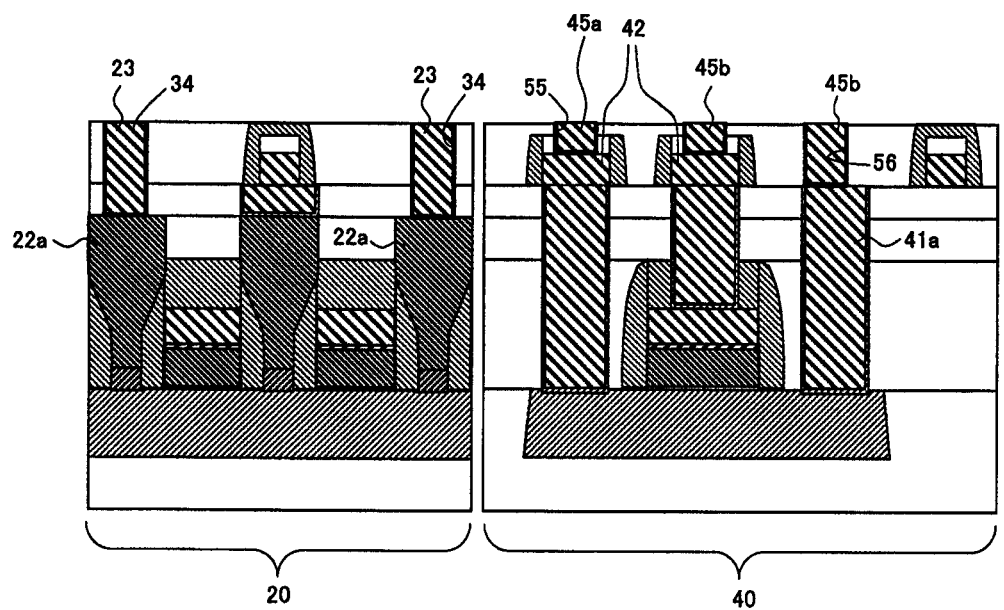

Thereafter, as shown in FIG. 5, holes 34, 55, 56 are filled with a conductive material, the excess of which is removed by CMP. In this way, in memory cell region 20, capacitance contact plugs 23 connected to contact plugs 22a are formed, and in peripheral circuit region 40, contact plugs 45a, 45b connected to second wiring layers 42 and contact plugs 41a are formed.

Figure 6:
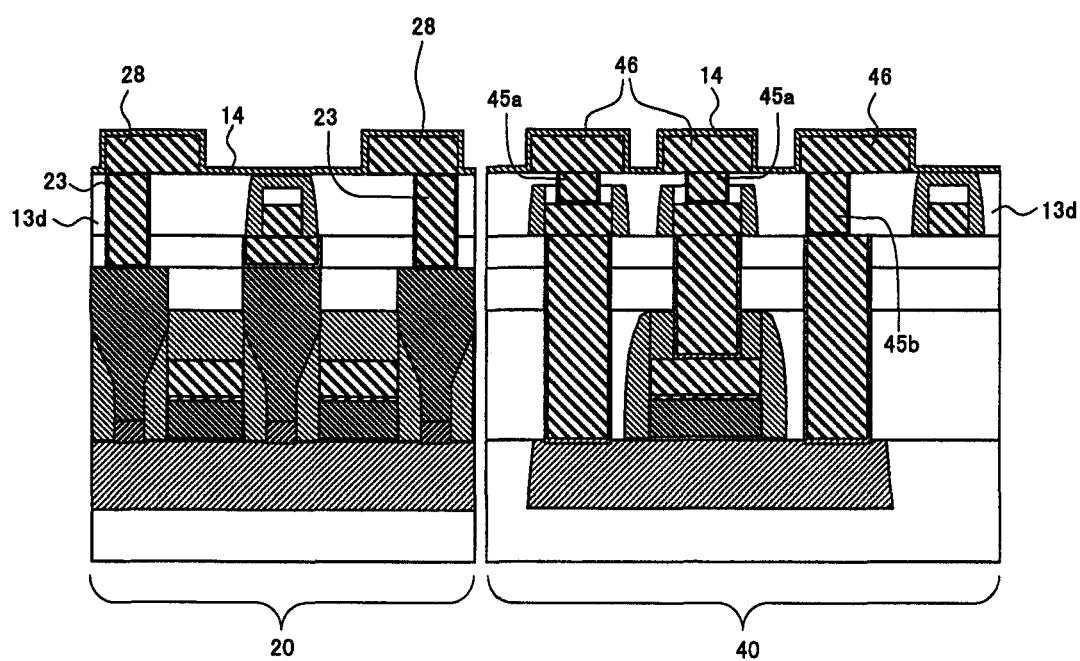

As shown in FIG. 6, a tungsten nitride film having a thickness of 10 nm and a tungsten film having a thickness of 40 nm are formed on interlayer insulating film 13d by a sputtering method, and thereafter patterns of the films are formed by lithography and dry etching. In this way, in memory cell region 20, capacitance contact pads 28 connected to capacitance contact plugs 23 are formed, and in peripheral circuit region 40, first wiring layers 46 connected to contact plugs 45a, 45b are formed. Then, a silicon nitride film having a thickness of 50 nm is deposited by a low-pressure CVD method to form cylinder stopper film 14.

Figure 7:
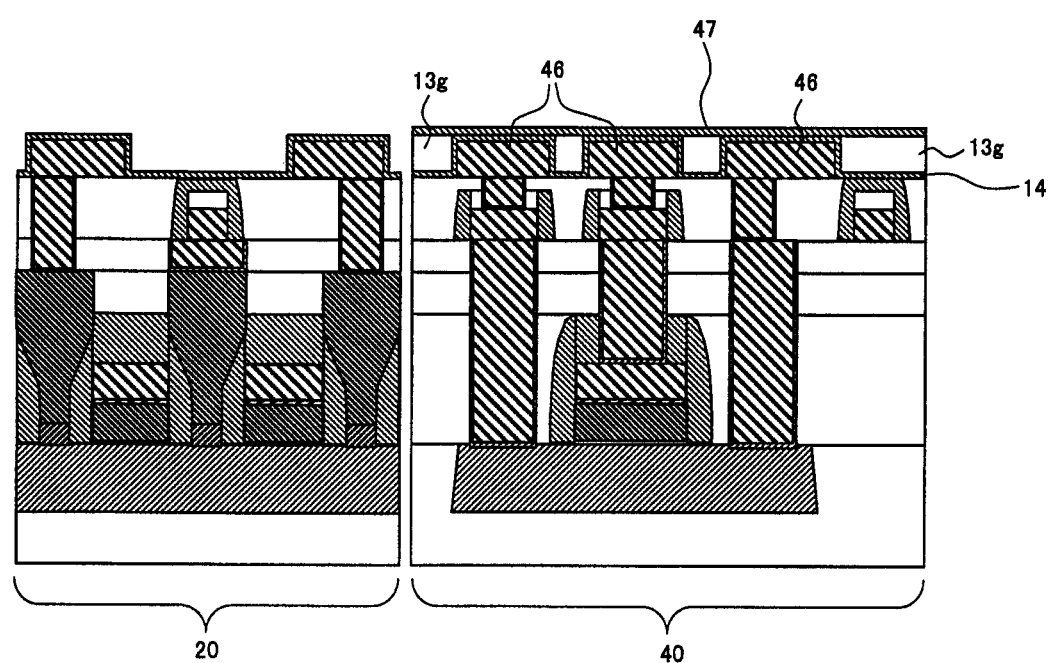

As shown in FIG. 7, interlayer insulating films 13g made of silicon oxide having a thickness of 50 nm are formed by the plasma CVD method so as to fill the non-wiring regions between the wiring patterns of first wiring layers 46 on which cylinder stopper film 14 is formed. After planarizing the surface of interlayer insulating film 13g, wet stopper film (first insulating film) 47 made of silicon nitride having a thickness of 50 nm is formed by the low pressure CVD method thereon.

In memory cell region 20, although a plurality of films also are formed by a process shown in FIG. 7, as in peripheral circuit region 40, they will be substantially removed in a subsequent process. This also applies to processes shown in FIGS. 8 and 9. Therefore, it should be noted that processes performed in memory cell region 20 are not shown in FIGS. 7 to 9 and their explanation will be omitted below.

Figure 8:
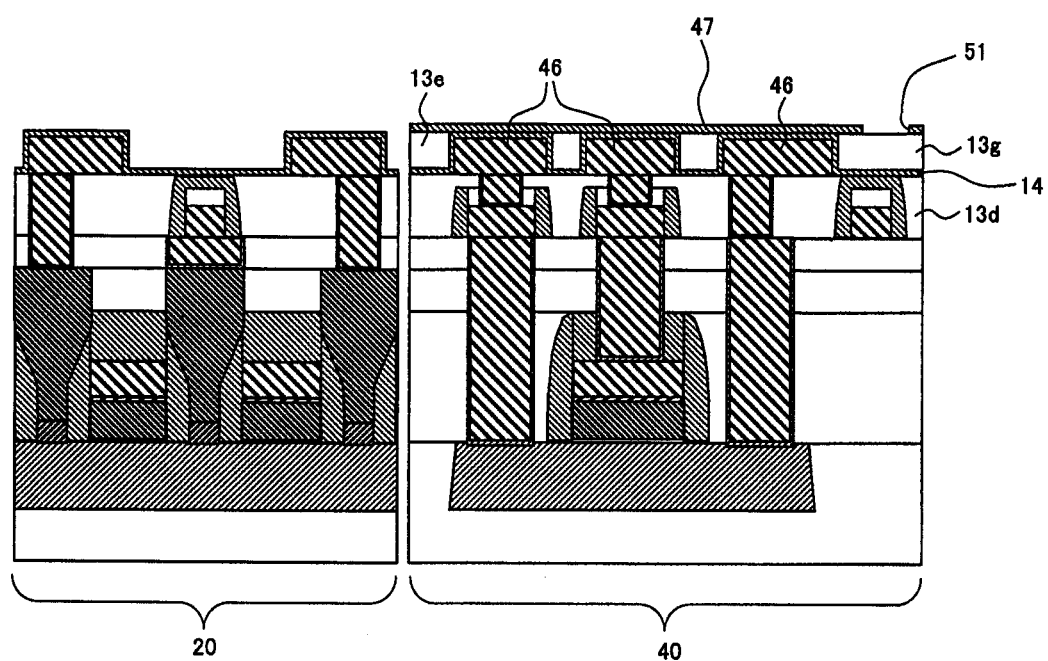

As shown in FIG. 8, opening 51 opened in the non-wiring region of first wiring layer 46 and exposing interlayer insulating film 13g is formed in wet stopper film 47 by lithography and dry etching. Thereafter, wet etching by hydrofluoric acid solution having a concentration of 5 to 50% is performed to remove interlayer insulating film 13g through opening 51. In such wet etching, an etching rate of silicon oxide (interlayer insulating film 13g) is higher than that of silicon nitride (wet stopper film 47). Therefore, before wet stopper film 47 made of silicon nitride is removed, interlayer insulating film 13g made of silicon oxide is removed by etching liquid flowing therein through opening 51. In this way, cavities 48 (see FIG. 9) are formed in the regions between the wiring patterns of first wiring layers 46. Interlayer insulating film 13d below first wiring layers 46 is not removed because it is protected from the etching liquid by silicon stopper film 14 made of silicon nitride.

Figure 9:
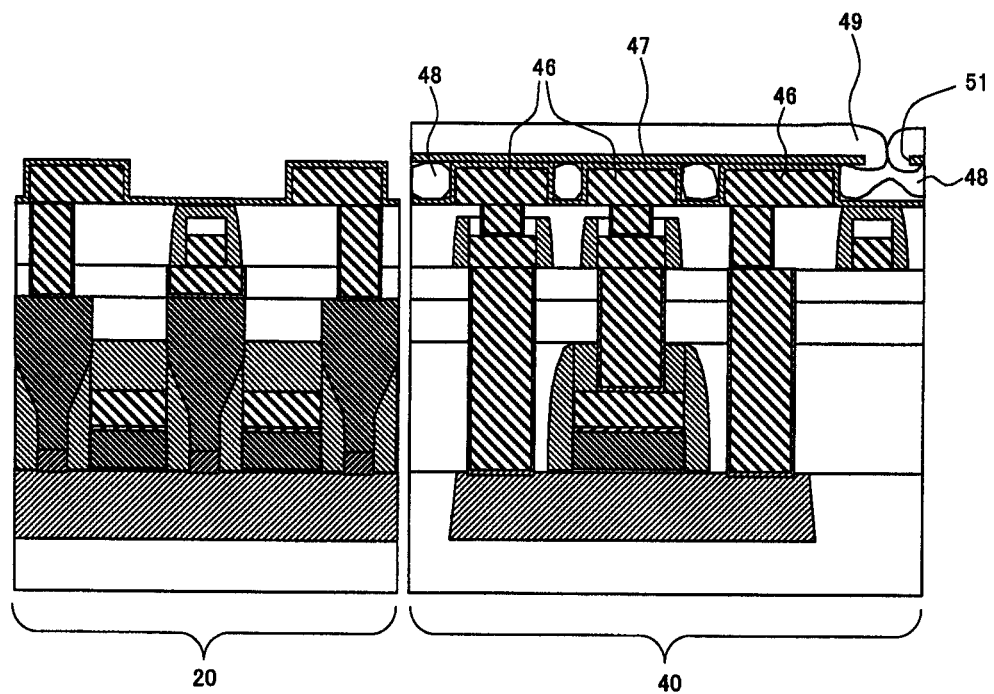

Thereafter, as shown in FIG. 9, silicon oxide film (second insulating film) 49 is deposited on wet stopper film 47 by the plasma CVD method using TEOS. At this point, the deposition of silicon oxide film 49 is performed under an optimum deposition condition such that opening 51 of wet stopper film 47 is closed with silicon oxide film 49 before cavities 48 are completely filled with silicon oxide film 49. This makes it possible to form layers above first wiring layers 46 while maintaining a state in which cavities 48 exist in the non-wiring regions of first wiring layers 46.

Figure 10:
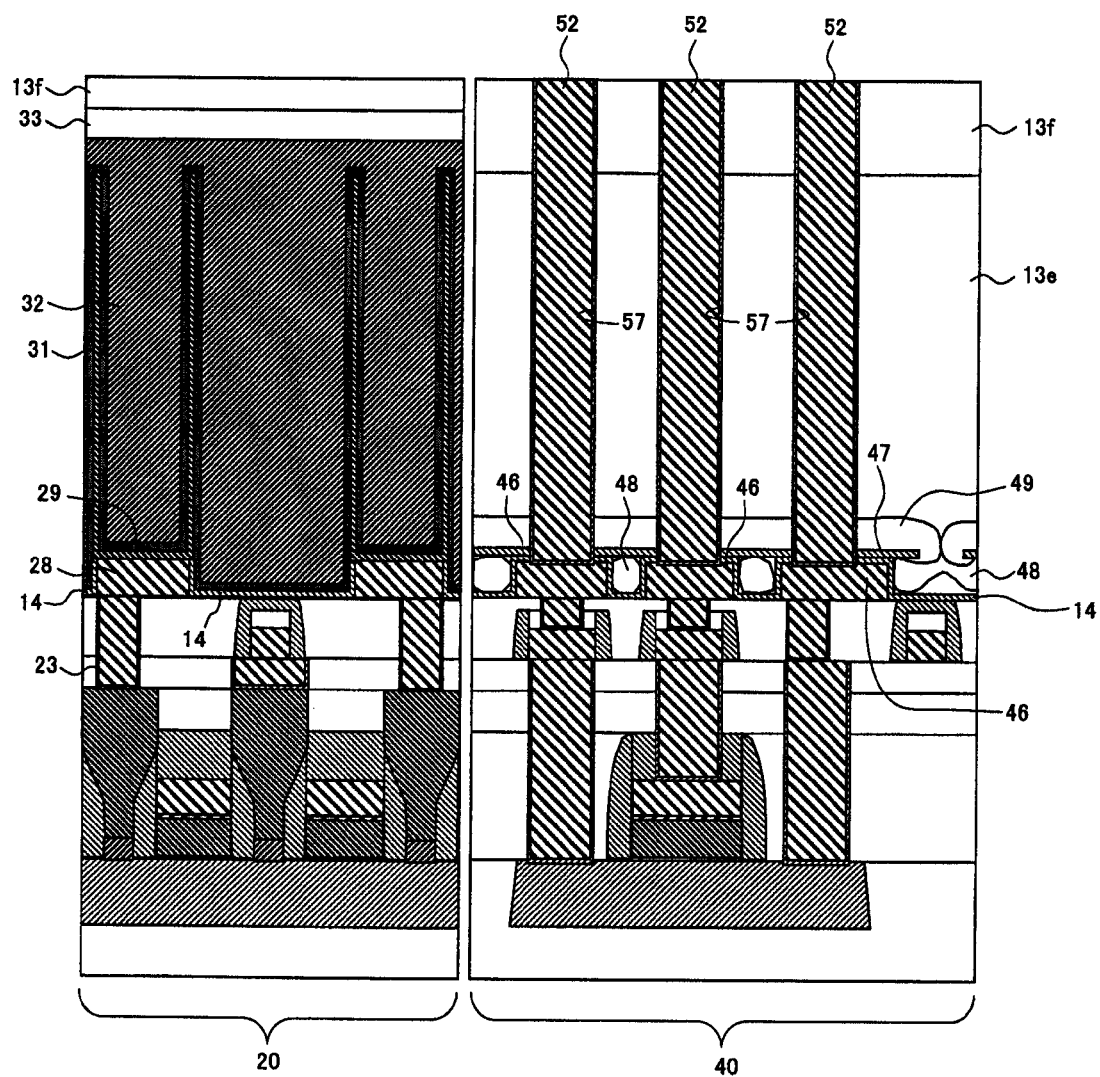

Interlayer insulating film 13e made of a laminated film of arsenic phosphoric silicate glass and silicon oxide is formed. In this case, in memory cell region 20, interlayer insulating film 13e is formed on cylinder stopper film 14 (not shown), and in peripheral circuit region 40, as shown in FIG. 10, interlayer insulating film 13e is formed on silicon oxide film 49. It should be noted that, since silicon oxide film 49 closes opening 51 of wet stopper film 47 in peripheral circuit region 40, interlayer insulating film 13e does not diffuse into cavities 48.

After interlayer insulating film 13e is formed, in memory cell region 20, holes (not shown) exposing capacitance contact pads 28 are formed by lithography and dry etching. A film that will become capacitor lower electrodes 29 is deposited to fill the holes. After cylindrical capacitor lower electrodes 29 are formed by lithography and dry etching, interlayer insulating film 13e is removed by wet etching. Thereafter, capacitance film 31 is formed to cover the surfaces of cylindrical capacitor lower electrodes 29. Plate electrode support film (upper electrode) 32 is formed to bury the capacitor lower electrodes 29 and the capacitance film 31. A film that will become plate electrode 33 is deposited on plate electrode support film 32, and then plate electrode 33 is produced by forming a pattern by lithography and dry etching.

Interlayer insulating film 13f made of silicon oxide is formed by the plasma CVD method. Consequently, in memory cell region 20, the pattern of plate electrode 33 is buried, and in peripheral circuit region 40, interlayer insulating film 13f is deposited on interlayer insulating film 13e. Thereafter, the surface of interlayer insulating film 13f is planarized by CMP.

In peripheral circuit region 40, holes 57 are formed by lithography and dry etching to pierce through interlayer insulating films 13f, 13e, silicon oxide film 49, wet stopper film 47, and cylinder stopper film 14 and to expose first wiring layers 46. In this embodiment, as described above, the layers that are the same as capacitance contact pads 28 of memory cell region 20 are formed as the wiring layers (first wiring layers 46) of peripheral circuit region 40. Therefore, the depth of through holes to be etched is reduced compared with that when first wiring layers 46 are not present. This allows a load in the etching process to be reduced.

Thereafter, holes 57 are filled with a conductive material, an excess of which is removed by CMP. In this way, through holes 52 connected to first wiring layers 46 are formed.

Figure 11:
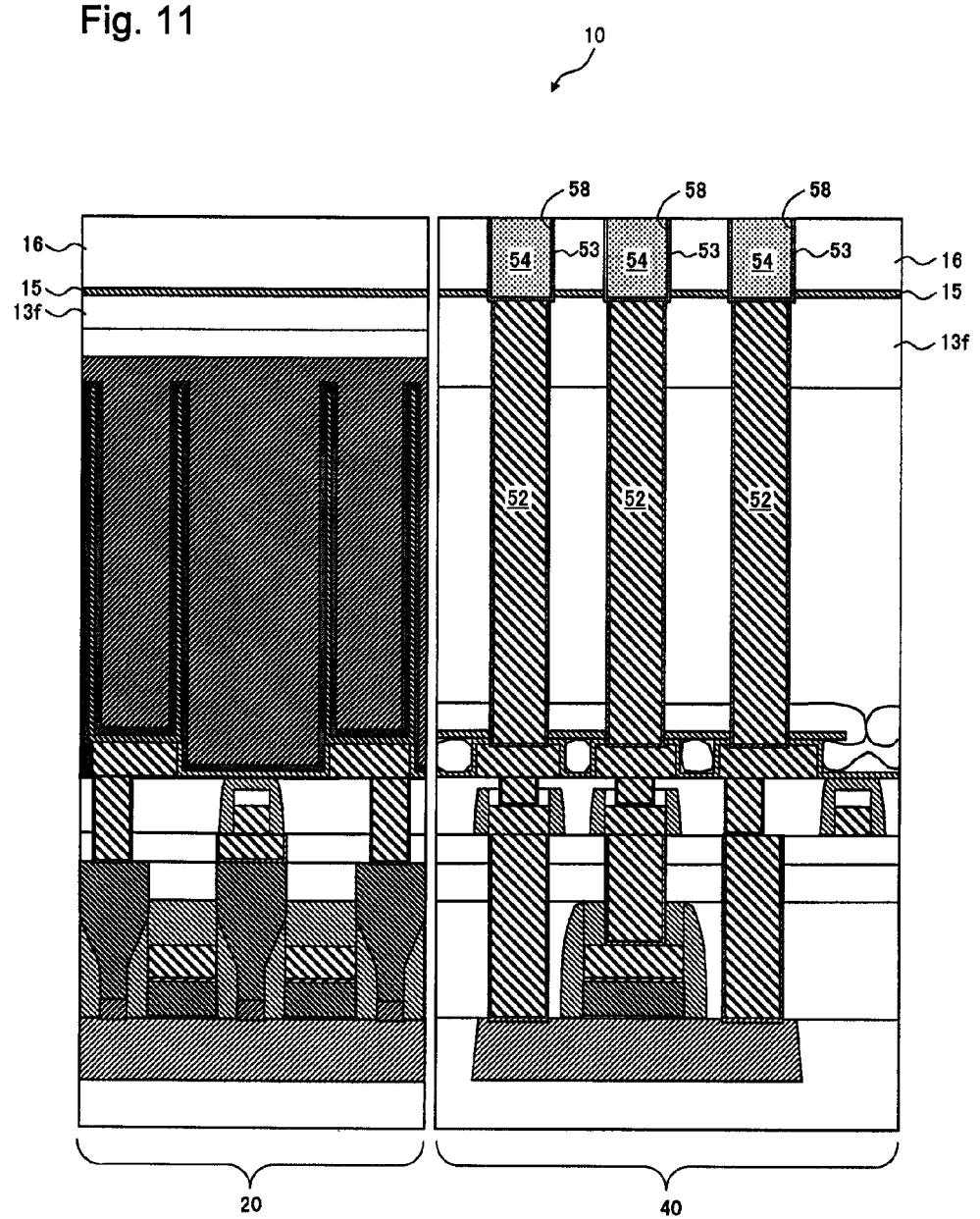

As shown in FIG. 11, Cu stopper film 15 and low dielectric constant film 16 are sequentially formed on interlayer insulating film 13f. In peripheral circuit region 40, holes 58 piercing through low dielectric constant film 16 and Cu stopper film 15 are formed by lithography and dry etching to expose through holes 52. Holes 58 are filled with Cu after depositing Cu barrier films 53 therein, and then excess Cu is removed by CMP to form Cu wirings 54. In this way, DRAM 10 is completed.

(Second Embodiment)

A second embodiment of the present invention will be explained below.

A DRAM in this embodiment is different from the DRAM in the first embodiment in that cavities are formed in regions between wiring patterns of second wiring layers that are the same as bit lines of a memory cell region and in that the configuration of insulating films near the cavities is partially changed in response to the formation of the cavities.

Figure 12:
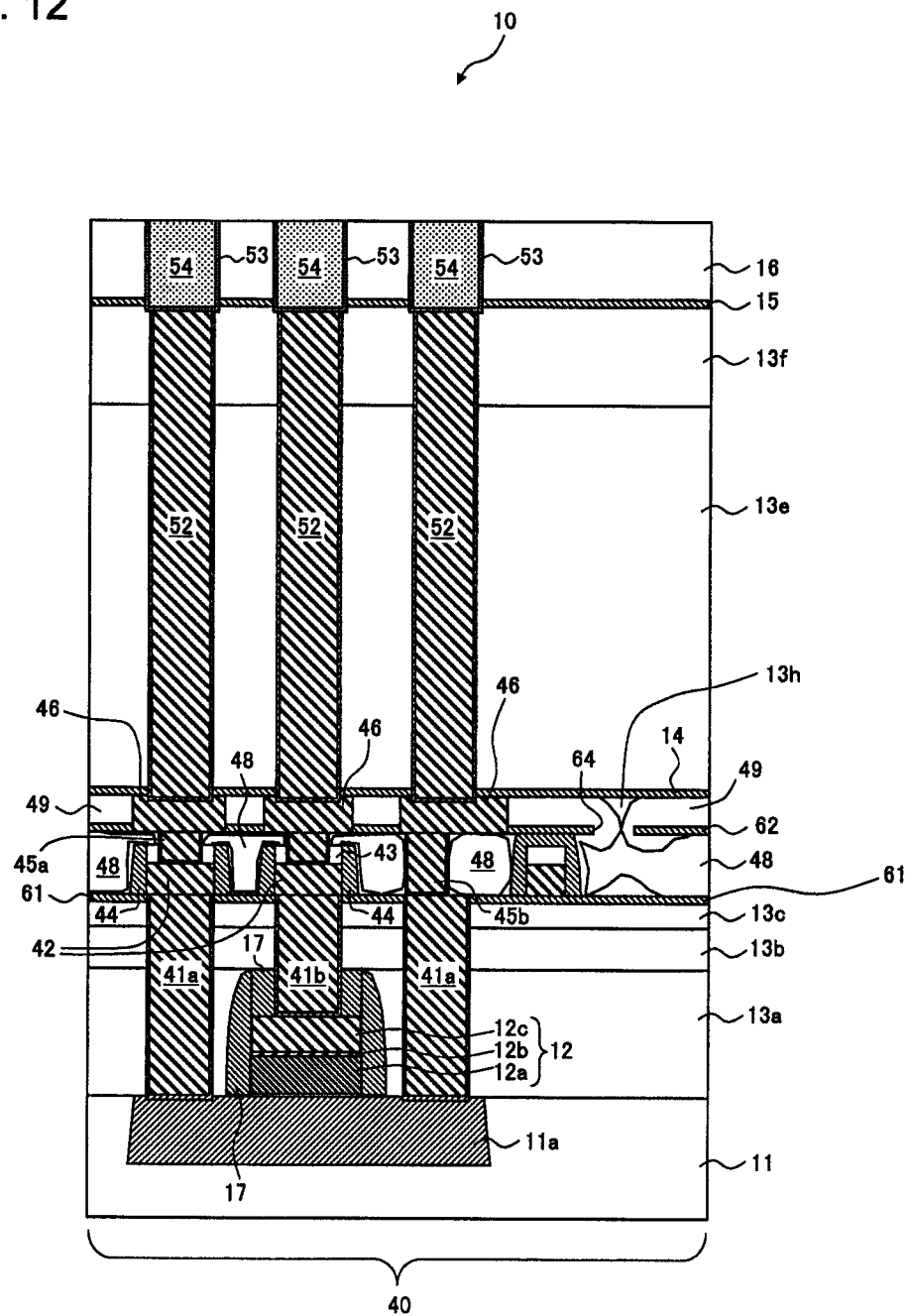
FIG. 12 is a sectional view schematically showing a DRAM as a semiconductor storage device in a second embodiment of the present invention.

FIG. 12 is a longitudinal sectional view schematically showing a peripheral circuit region of the DRAM in the second embodiment, and shows a section taken along a direction perpendicular to the substrate. A memory cell region in this embodiment has the same configuration as that in the first embodiment. Therefore, the memory cell region is not shown in the figure.

In this embodiment, wet stopper film 61 made of silicon nitride is provided between interlayer insulating film 13c and second wiring layers 42. Wet stopper film (first insulating film) 62 made of silicon nitride is provided on second wiring layers 42. Cavities 48 are formed in regions between wiring patterns of second wiring layers 42 sandwiched between wet stopper films 61 and 62. Silicon oxide film 49 forming at least a part of walls defining cavities 48 is provided on wet stopper film 62 to close opening 64 of wet stopper film 62 and to bury wiring patterns of first wiring layers 46.

In this way, cavities 48 defined by silicon oxide film 49 are formed in the non-wiring regions between the wiring patterns of second wiring layers 42. This allows the capacitance between the wiring patterns of second wiring layers 42 to be reduced and the signal delay to be suppressed.

Further, as in the first embodiment, cylinder stopper film 14 is formed on first wiring layers 46. However, cylinder stopper film 14 in this embodiment is not formed along the wiring patterns of first wiring layers 46 unlike the first embodiment. Interlayer insulating film 13h is formed in a space between cylinder stopper film 14 and silicon oxide film 49 near opening 64 of wet stopper film 62.

It should be noted that components other than those explained above in this embodiment and effects obtained by this embodiment are respectively the same as those in the first embodiment.

A method of manufacturing a DRAM in the second embodiment will be explained below.

FIGS. 13 to 16 are schematic sectional views of the DRAM in several steps of the manufacturing method thereof according to this embodiment. In these figures, sections taken along a direction perpendicular to the substrate are respectively shown.

Figure 13:
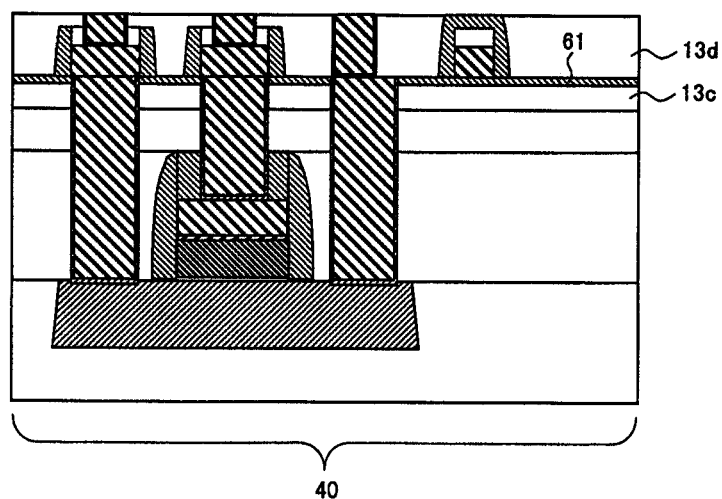
FIGS. 13 to 16 are diagrams showing steps of a method of manufacturing the DRAM in the second embodiment of the present invention.

In the manufacturing method of the DRAM according to this embodiment, steps up to FIG. 13 are the same as those up to FIG. 5 in the first embodiment except that wet stopper film 61 made of silicon nitride is formed on interlayer insulating film 13c.

Figure 14:
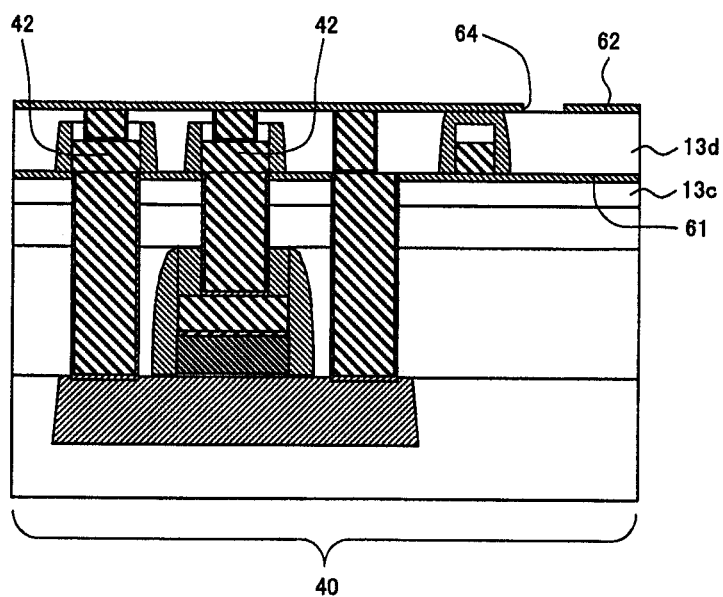

As shown in FIG. 14, wet stopper film 62 made of silicon nitride having a thickness of 50 nm is formed on interlayer insulating film 13d by the low pressure CVD method. Next, opening 64 opened in the non-wiring region of second wiring layer 42 and exposing interlayer insulating film 13d is formed in wet stopper film 62 by lithography and dry etching. Thereafter, wet etching by hydrofluoric acid solution having a concentration of 5 to 50% is performed to remove interlayer insulating film 13d through opening 64. In such wet etching, an etching rate of silicon oxide (interlayer insulating film 13d) is higher than that of silicon nitride (wet stopper film 62). Therefore, before wet stopper film 62 made of silicon nitride is removed, interlayer insulating film 13d made of silicon oxide is removed by etching liquid flowing therein through opening 64. In this way, cavities 48 (see FIG. 15) are formed in the regions between the wiring patterns of second wiring layers 42. Interlayer insulating film 13c below second wiring layers 42 is not removed because it is protected from the etching liquid by wet stopper film 61 made of silicon nitride.

Figure 15:
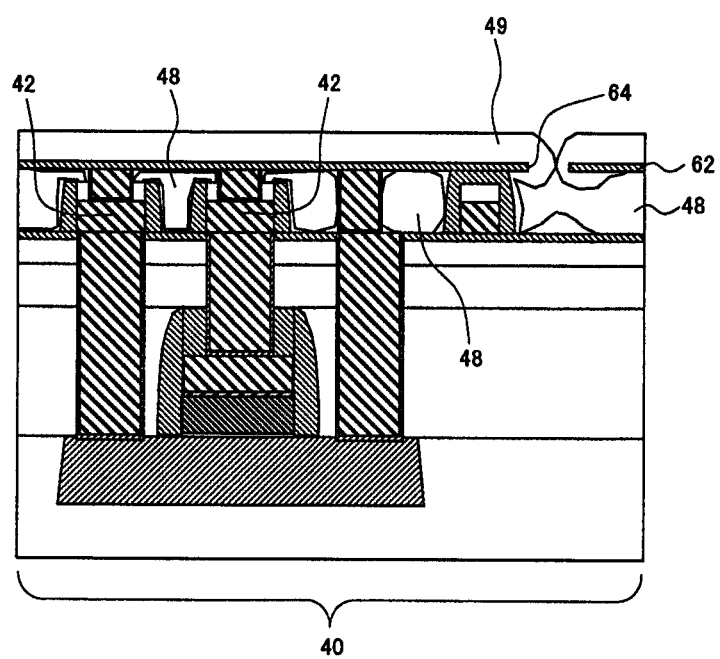

Thereafter, as shown in FIG. 15, silicon oxide film (second insulating film) 49 is deposited on wet stopper film 62 by the plasma CVD method using TEOS. At this point, the deposition of silicon oxide film 49 is performed under an optimum deposition condition such that opening 64 of wet stopper film 62 is closed with silicon oxide film 49 before cavities 48 are completely filled with silicon oxide film 49. This makes it possible to form layers above second wiring layers 42 while maintaining a state in which cavities 48 exist in the non-wiring regions of second wiring layers 42.

Figure 16:
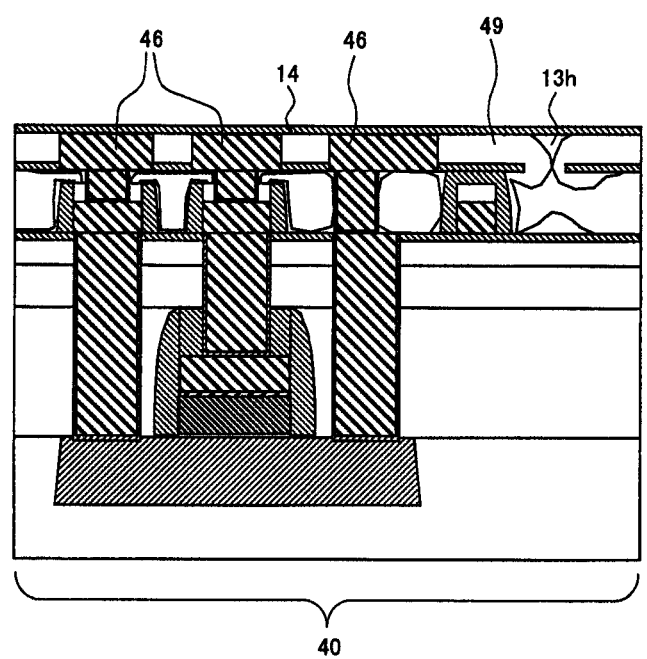

As shown in FIG. 16, interlayer insulating film 13h is formed on silicon oxide film 49 and then planarized by CMP. Thereafter, first wiring layers 46 and cylinder stopper film 14 are formed in the same procedure as that shown in FIG. 6 in the first embodiment.

After this procedure, DRAM 10 shown in FIG. 12 is completed through the same steps as those (shown in FIGS. 10 and 11) in the first embodiment.

(Third Embodiment)

A third embodiment of the present invention will be explained below.

Figure 17:
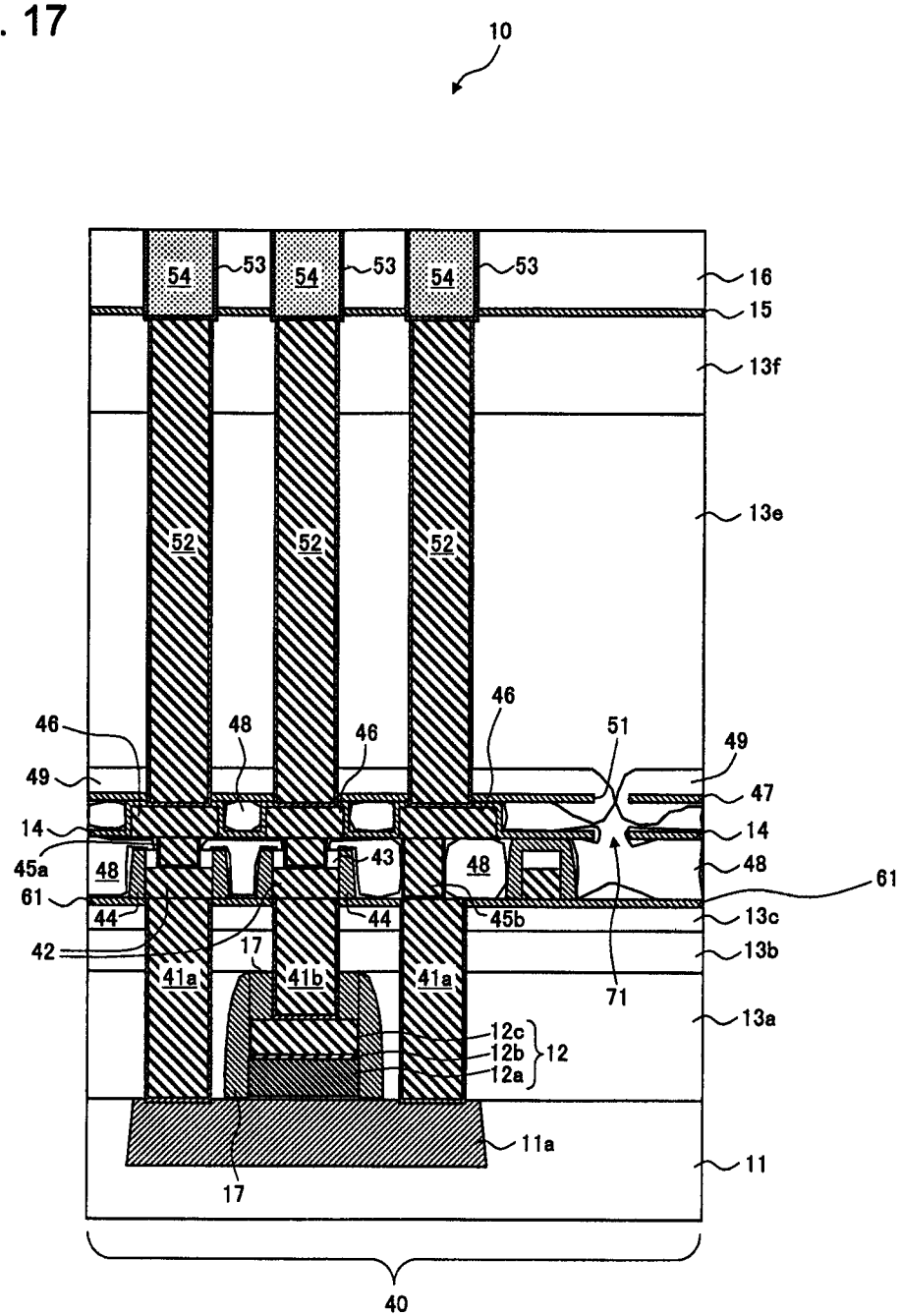
FIG. 17 is a sectional view schematically showing a DRAM as a semiconductor storage device in a third embodiment of the present invention.

FIG. 17 is a longitudinal sectional view schematically showing a peripheral circuit region of the DRAM in the third embodiment, and shows a section taken along a direction perpendicular to the substrate. A memory cell region in this embodiment has the same configuration as that in the first embodiment. Therefore, the memory cell region is not shown in the figure.

This embodiment has a configuration obtained by combining those in the first and second embodiments. Specifically, cavities 48 are formed in the non-wiring regions between wiring patterns in first wiring layers 46 as well as in the second wiring layers 42. As a result, in this embodiment, the capacitances between the wiring patterns in both first and second wiring layers 46, 42 can be reduced. Therefore, it is possible to further suppress the signal delay.

In this embodiment, a change in response to this combination is that a film formed on second wiring layers 42 is not cylinder stopper film 14 in the first embodiment but is cylinder stopper film 14 including opening 71. In addition, another change in this embodiment is that silicon oxide film 49 closes only the upper one (of wet stopper film 47) of two openings 51, 64. Most of the components other than those explained above and effects to be obtained of this embodiment are the same as those of the first or second embodiment.

Figure 18:
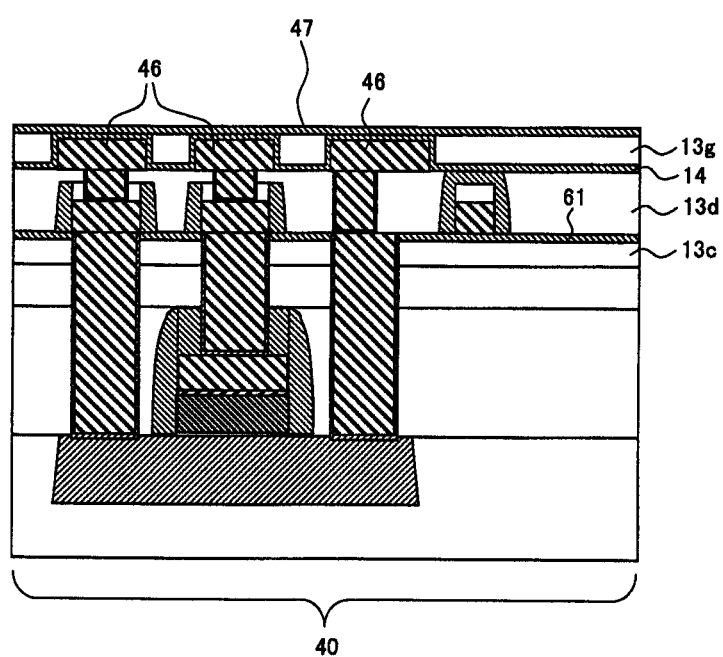
FIGS. 18 to 20 are diagrams showing steps of a method of manufacturing the DRAM in the third embodiment of the present invention.
Figure 19:
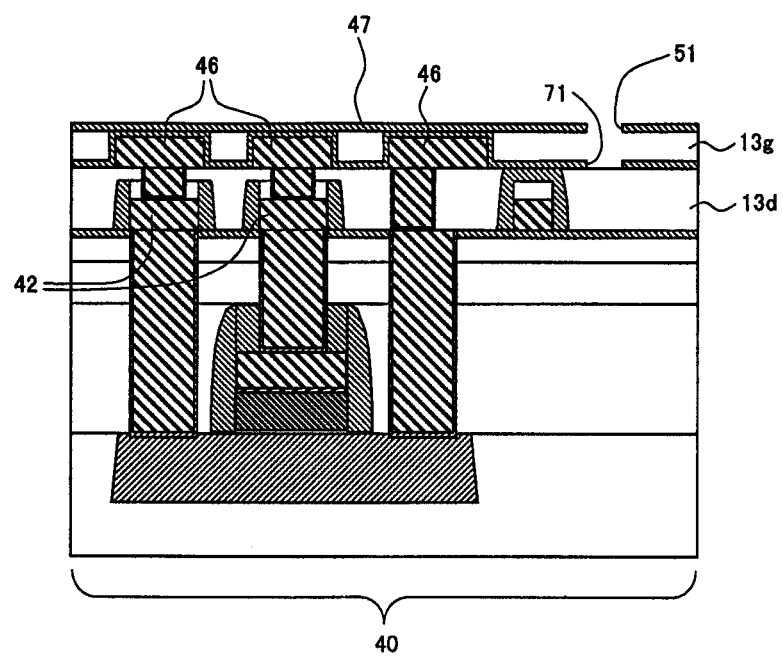
Figure 20:
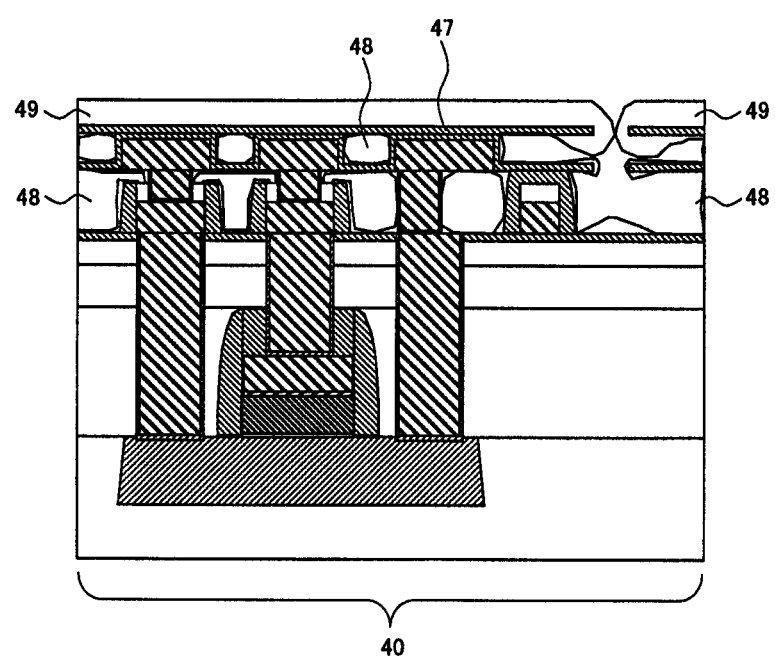

FIGS. 18 to 20 are schematic sectional views of the DRAM in several steps of the manufacturing method thereof according to this embodiment. In these figures, sections taken along a direction perpendicular to the substrate are respectively shown.

In this embodiment, first, the manufacturing process of the DRAM is carried out up to the state shown in FIG. 13 in the second embodiment.

Thereafter, as shown in FIG. 18, first wiring layers 46, cylinder stopper film 14, interlayer insulating film 13g, and wet stopper film 47 are sequentially formed on interlayer insulating film 13d by the same procedure as those shown in FIGS. 6 and 7 in the first embodiment.

Next, as shown in FIG. 19, openings 51, 71 are respectively formed in wet stopper film 47 and cylinder stopper film 14 to expose interlayer insulating film 13d in the non-wiring regions of second wiring layers 42 by lithography and dry etching. Thereafter, wet etching by hydrofluoric acid solution having a concentration of 5 to 50% is performed to remove interlayer insulating films 13g, 13d through openings 51, 71. In such wet etching, the etching rates of both SOD (interlayer insulating film 13d) and silicon oxide (interlayer insulating film 13g) are higher than that of silicon nitride (wet stopper film 47 and cylinder stopper film 14). Therefore, before wet stopper film 47 and cylinder stopper film 14 made of silicon nitride are removed, interlayer insulating film 13d made of SOD and interlayer insulating film 13g made of silicon oxide are removed by etching liquid flowing therein from openings 51, 71. In this way, cavities 48 (see FIG. 20) are formed in the regions between the wiring patterns of both first wiring layers 46 and second wiring layers 42.

Thereafter, as shown in FIG. 20, silicon oxide film 49 is formed on wet stopper film 47 by the same procedure as that shown in FIG. 9 in the first embodiment.

After this procedure, DRAM 10 shown in FIG. 17 is completed using the same steps as those (shown in FIGS. 10 and 11) in the first embodiment.

(Fourth Embodiment)

A fourth embodiment of the present invention will be explained below.

This embodiment is a variant of the first embodiment shown in FIG. 1, wherein a configuration of capacitance contact pads and first wiring layers is modified.

Figure 21:
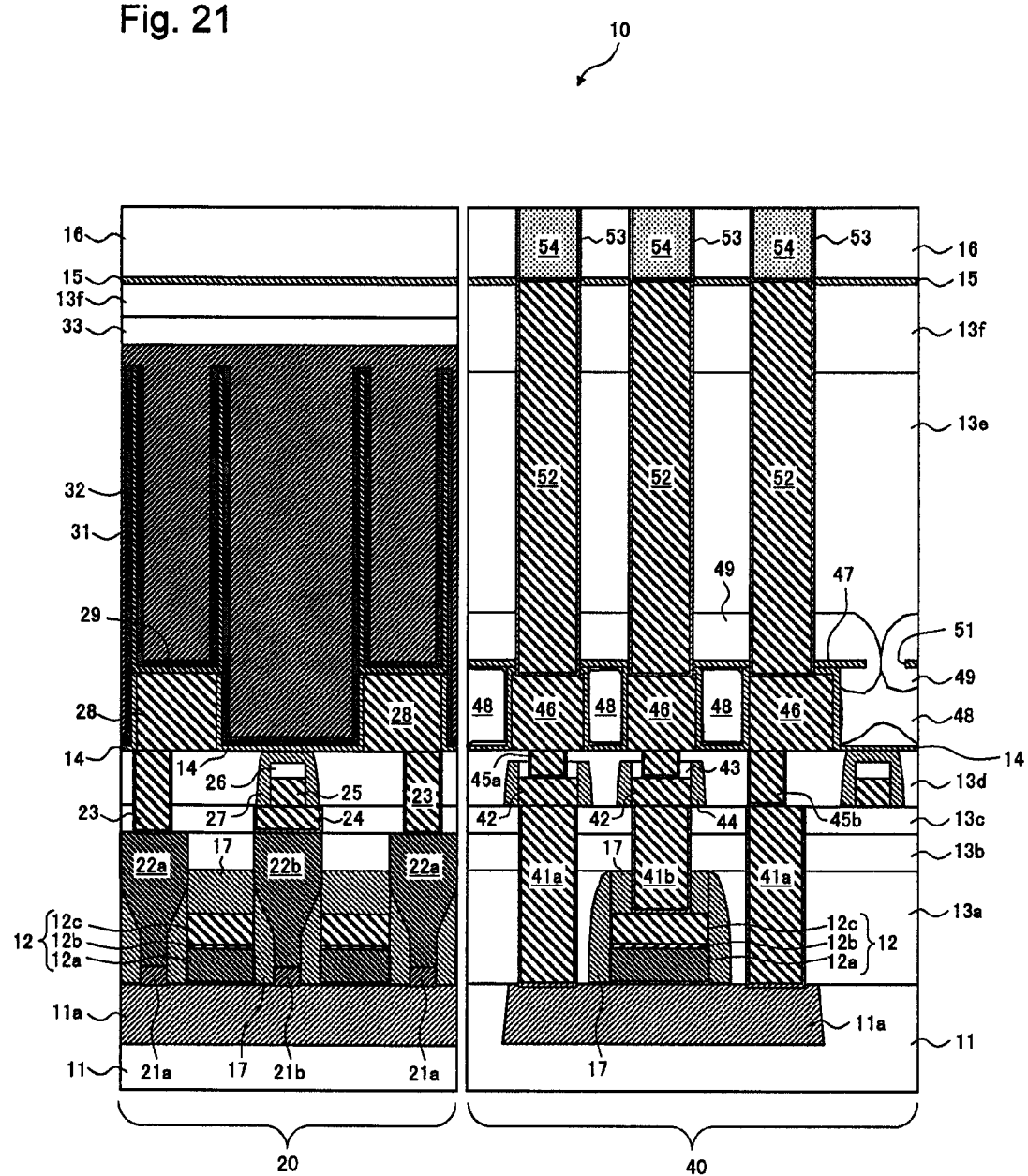
FIG. 21 is a sectional view schematically showing a DRAM as a semiconductor storage device in a fourth embodiment of the present invention.

FIG. 21 is a sectional view schematically showing DRAM 10 in the fourth embodiment, and shows a section taken along a direction perpendicular to the substrate.

In this embodiment, the thickness of capacitance contact pads 28 of memory cell region 20 and first wiring layer 46 of peripheral circuit region 40 is large compared with that in the first embodiment shown in FIG. 1. Specifically, while the thickness of capacitance contact pads 28 and first wiring layers 46 is 50 nm in the first embodiment, it is 400 nm (10 nm of tungsten and 390 nm of tungsten nitride) in this embodiment. This allows the capacitance of the capacitor to be increased in this embodiment. In other words, capacitor lower electrodes 29 and capacitance contact pads 28 are made of the same material, whereby an area of lower electrodes can be substantially expanded by side portions of capacitance contact pads 28, leading to an increase in capacitance of the capacitor.

Components other than those explained above in this embodiment and effects obtained by this embodiment are respectively the same as those in the first embodiment. In addition, a method of manufacturing the DRAM in this embodiment is the same as those in the first embodiment except that the thickness of the layers is changed as explained above.

(Fifth Embodiment)

Figure 22:
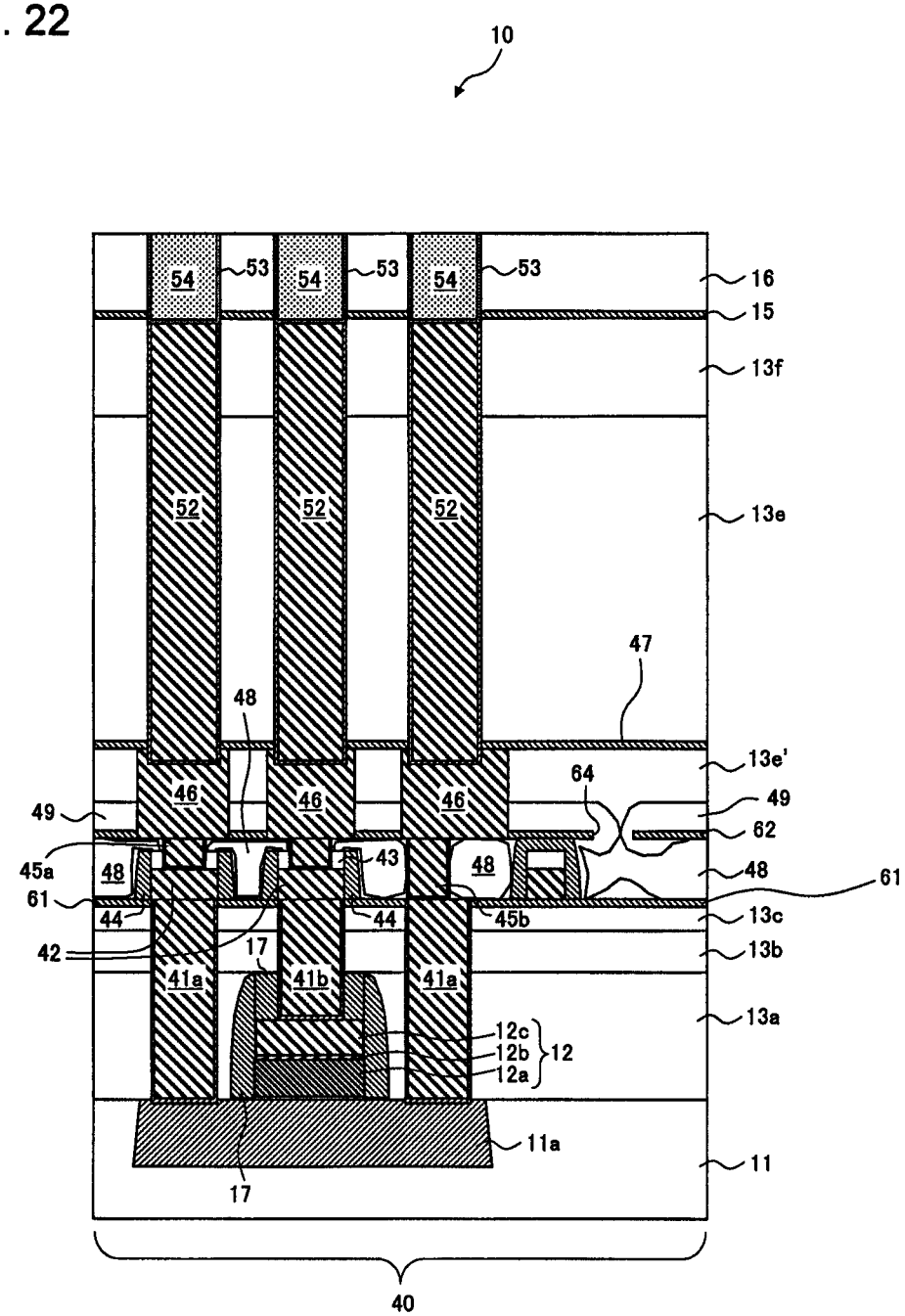
FIG. 22 is a sectional view schematically showing a DRAM as a semiconductor storage device in a fifth embodiment of the present invention.

FIG. 22 is a longitudinal sectional view schematically showing a peripheral circuit region of the DRAM in a fifth embodiment, and shows a section taken along a direction perpendicular to the substrate. A memory cell region in this embodiment has the same configuration as that in the first embodiment. Therefore, the memory cell region is not shown in the figure.

This embodiment is a variant of the second embodiment, wherein the change to the configuration in the first embodiment, that is implemented in the fourth embodiment, is applied to the second embodiment. Specifically, in this embodiment, the thickness of first wiring layers 46 of peripheral circuit region 40 (as well as capacitance contact pads 28 of memory cell region 20) is large compared with that in the second embodiment shown in FIG. 12. Also in this embodiment, interlayer insulating film 13e' is provided on silicon oxide film 49 rather than interlayer insulating film 13h in the second embodiment. First wiring layers 46 are buried in silicon oxide film 49 and interlayer insulating film 13e'. The fifth embodiment is also different from the second embodiment in this point.

Components other than those explained above in this embodiment are the same as those in the second embodiment. A method of manufacturing the DRAM in this embodiment is also the same as that in the second embodiment except that the thickness of the layers is changed as explained above and that first wiring layers 46 are formed after forming interlayer insulating film 13e on silicon oxide film 49. Effects obtained by this embodiment are the same as those in the fourth embodiment.

(Sixth Embodiment)

Figure 23:
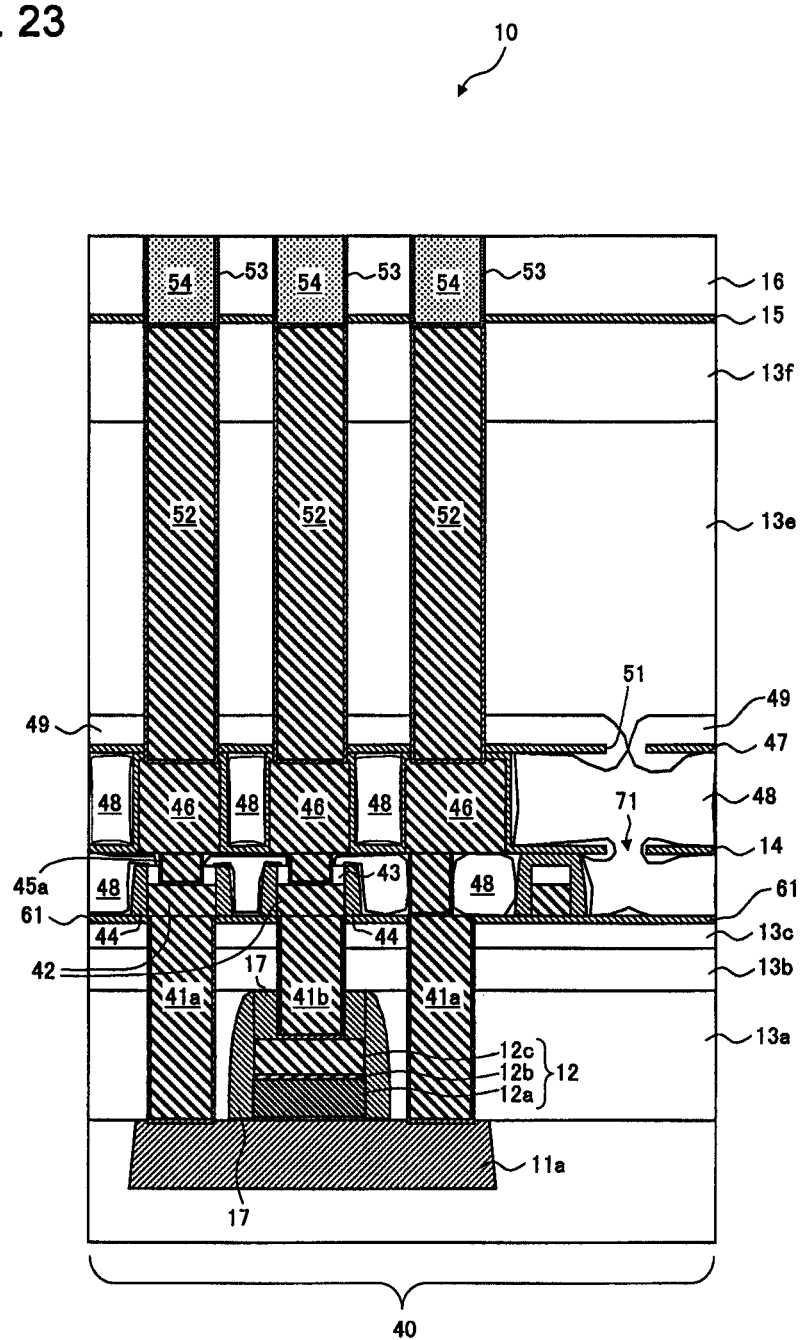
FIG. 23 is a sectional view schematically showing a DRAM as a semiconductor storage device in a sixth embodiment of the present invention.

FIG. 23 is a longitudinal sectional view schematically showing a peripheral circuit region of the DRAM in a sixth embodiment, and shows a section taken along a direction perpendicular to the substrate. A memory cell region in this embodiment has the same configuration as that in the first embodiment. Therefore, the memory cell region is not shown in the figure.

This embodiment is a variant of the third embodiment, wherein the change to the configuration in first embodiment, that is implemented in the fourth embodiment, is applied to the third embodiment. Specifically, in this embodiment, the thickness of first wiring layers 46 of peripheral circuit region 40 (as well as capacitance contact pads 28 of memory cell region 20) is large compared with that in the third embodiment shown in FIG. 17.

Components other than those explained above in this embodiment are the same as those in the third embodiment. A method of manufacturing the DRAM in this embodiment is also the same as the third embodiment except that the thickness of the layers is changed as explained above. Effects obtained by this embodiment are the same as those in the fourth embodiment.

Further, according to the present invention, there is also provided a method of manufacturing a semiconductor storage device including a peripheral circuit region and a memory cell region, the method comprising forming a wiring layer having wiring patterns in the peripheral circuit region, forming a first insulating film above the wiring layer after forming an interlayer insulating film to fill a non-wiring region between the wiring patterns, forming an opening in the first insulating film to expose the interlayer insulating film, forming a cavity in the non-wiring region by removing the interlayer insulating film through the opening, and forming a second insulating film on the first insulating film not to fill the cavity after removing the interlayer insulating film.

In the method of manufacturing a semiconductor storage device, said forming a wiring layer may comprise forming the wiring layer simultaneously with forming a capacitance contact pad in the memory cell region, the capacitance contact pad connecting a capacitance contact plug and a capacitor lower electrode of the memory cell region, the method further comprising forming a through hole on the wiring layer after forming the second insulating film.

In the method of manufacturing a semiconductor storage device, said forming a wiring layer may comprise forming the wiring layer on a contact plug of the peripheral circuit region simultaneously with forming a bit line of the memory cell region.

In the method of manufacturing a semiconductor storage device, said forming a cavity may comprise removing the interlayer insulating film by wet etching. An etching rate of the interlayer insulating film is preferably higher than that of the first insulating film.

In the method of manufacturing a semiconductor storage device, the interlayer insulating film is preferably made of silicon oxide and the first insulating film is preferably made of silicon nitride.

In the method of manufacturing a semiconductor storage device, said forming a second insulating film may comprise forming a second insulating film made of tetraethoxysilane by a plasma CVD method.

It is apparent that the present invention is not limited to the above embodiments, but may be modified and changed without departing from the scope and spirit of the invention.

What is claimed is:

1. A semiconductor device comprising:
   a wiring layer having wiring patterns;
   a cavity formed in a non-wiring region between the wiring patterns of the wiring layer;
   an insulating film forming at least a part of a wall defining the cavity;
   an etching stopper film separating the insulating film from the wiring patterns; and
   a wet stopper film provided above the etching stopper film, the wet stopper film including a first portion and a second portion, the first portion contacting the etching stopper film, the second portion spaced from the etching stopper film, the second portion and the etching stopper film defining at least a part of the cavity therebetween.

2. The semiconductor device according to claim 1, further comprising a peripheral region, wherein the wiring layer is one of a plurality of layers that connect a contact plug and a through hole of the peripheral circuit region, and wherein the wiring layer is connected to either the contact plug or the through hole.

3. The semiconductor device according to claim 2, further comprising a memory cell region, wherein the wiring layer is the same as a capacitance contact pad that connects a capacitance contact plug and a capacitor lower electrode of the memory cell region, and wherein the through hole is provided on the wiring layer.

4. The semiconductor device according to claim 2, further comprising a memory cell region, wherein the wiring layer is the same as a bit line of the memory cell region, and wherein the wiring layer is provided on the contact plug.

5. The semiconductor device according to claim 1, wherein the insulating film is made of tetraethoxysilane.

6. The semiconductor device according to claim 1, wherein the insulating film is connected to an upper surface of the wet stopper film.

7. A semiconductor device comprising:
   a wiring layer having wiring patterns;
   a cavity formed in a non-wiring region between the wiring patterns of the wiring layer;
   a first insulating film provided above the wiring layer, the first insulating film having a first opening opened in the non-wiring region;
   a second insulating film provided on the first insulating film to close the first opening, the second insulating film forming at least a part of a wall defining the cavity; and
   an etching stopper film separating the second insulating film from the wiring patterns, the etching stopper film including a first portion and a second portion, the first portion contacting the first insulating film, the second portion being spaced from the first insulating film, the second portion and the first insulating film defining at least a part of the cavity therebetween.

8. The semiconductor device according to claim 7, further comprising a peripheral region, wherein the wiring layer is one of a plurality of layers that connect a contact plug and a through hole of the peripheral circuit region, and wherein the wiring layer is connected to either the contact plug or the through hole.

9. The semiconductor device according to claim 8, further comprising a memory cell region, wherein the wiring layer is the same as a capacitance contact pad that connects a capacitance contact plug and a capacitor lower electrode of the memory cell region, and wherein the through hole is provided on the wiring layer.

10. The semiconductor device according to claim 8, further comprising a memory cell region, wherein the wiring layer is the same as a bit line of the memory cell region, and wherein the wiring layer is provided on the contact plug.

11. The semiconductor device according to claim 7, wherein the first insulating film is made of silicon nitride.

12. The semiconductor device according to claim 7, wherein the second insulating film is made of tetraethoxysilane.

13. The semiconductor device according to claim 7, wherein the second insulating film is connected to an upper surface and a bottom surface of the first insulating film.

14. The semiconductor device according to claim 7, wherein the etching stopper film includes a second opening opened in the non-wiring region.

15. A semiconductor device comprising:
   first and second wiring layers each having wiring patterns, the first wiring layer being provided above the second wiring layer;
   a cavity formed in one or more non-wiring regions between the wiring patterns in the first wiring layer and between the wiring patterns in the second wiring layer;
   an insulating film forming at least a part of a wall defining the cavity;
   an etching stopper film separating the insulating film from the wiring patterns of the first or second wiring layer; and
   a wet stopper film provided above the etching stopper film, the wet stopper film including a first portion and a second portion the first portion contacting the etching stopper film, the second portion being spaced from the etching stopper film, the second portion and the etching stopper film defining at least a part of the cavity therebetween.

16. The semiconductor device according to claim 15, wherein the cavity is formed in the non-wiring region between the wiring patterns in the first wiring layer and the non-wiring region between the wiring patterns in the second wiring layer.

17. The semiconductor device according to claim 15, further comprising a peripheral region, wherein the first and second wiring layers constitute a plurality of layers that connect a contact plug and a through hole of the peripheral circuit region.

18. The semiconductor device according to claim 17, further comprising a memory cell region, wherein the first wiring layer is the same as a capacitance contact pad that connects a capacitance contact plug and a capacitor lower electrode of the memory cell region, wherein the through hole is provided on the first wiring layer, and wherein the second wiring layer is the same as a bit line of the memory cell region, and wherein the wiring layer is provided on the contact plug.

19. The semiconductor device according to claim 15, wherein the insulating film is made of tetraethoxysilane.

20. The semiconductor device according to claim 15, wherein the insulating film is connected to an upper surface of the wet stopper film.

* * * * *